Aug. 28, 1956 C. T. HALL 2,761,019

DIRECT COUPLED POWER AMPLIFIERS

Filed Oct. 18, 1950 2 Sheets-Sheet 1

INVENTOR.
Cecil T. Hall
BY
William D. Carothers
HIS ATTORNEY

INVENTOR.
Cecil T. Hall
BY William D. Carothers
HIS ATTORNEY

United States Patent Office 2,761,019

Patented Aug. 28, 1956

2,761,019

DIRECT COUPLED POWER AMPLIFIERS

Cecil T. Hall, Mount Lebanon, Pa.

Application October 18, 1950, Serial No. 190,706

4 Claims. (Cl. 179—171)

This invention relates to an electronic power amplifier capable of supplying power in the lower portion of the frequency spectrum to a low impedance load, and more particularly to an electronic power amplifier capable of supplying essentially undistorted audio frequency power to a direct coupled low impedance load such as a loudspeaker, recording head, or the like.

With a conventional amplifier, a coupling device or output transformer is employed to transfer the power supplied by the amplifier to a load such as a loudspeaker, recording head, or the like. It is recognized that various undesirable characteristics inherent in an output transformer seriously impair the ability of such an amplifier to supply undistorted audio frequency power to its load; a few of the undesirable characteristics being limited frequency response, and the lower loss and phase shift which are variable depending upon the frequency. These characteristics and their effects are particularly well understood by those skilled in the art. Accordingly, attempts have been made to improve the design of the coupling device or output transformer, however, such attempts have merely diminished the effect of these inherent undesirable characteristics.

Further characteristics with regard to an amplifier which supplies power to a load such as a loudspeaker, recording head, or the like, that require consideration are the characteristics of the load and the interaction between the load and the amplifier. From an examination of a typical curve showing the impedance of a conventional dynamic loudspeaker as a function of frequency, it is apparent that such a load has its lowest impedance at some frequency which usually is in the range from 400 to 1000 cycles per second, and that its impedance at other frequencies may be many times larger than its lowest impedance. Furthermore, the impedance at different frequencies may have a large inductive reactance component, or a large capacitive reactance component, or it may be essentially a resistance. Because the impedance characteristics of various loudspeakers are considerably different, depending upon the size and design of the loudspeaker, it is customary practice to determine the characteristics of an amplifier when it is supplying power to a resistive load of some particular value rather than when it is supplying power to a loudspeaker. In this procedure, it follows that any departures from expected results when the amplifier is supplying power to a loudspeaker is treated as a fault of the loudspeaker.

In view of the foregoing, it is apparent that an amplifier which supplies power to a load such as a dynamic loudspeaker or the like should be capable of responding to the various conditions imposed by the load. The customary manner of attempting to cause an amplifier to respond to the variations of the load is to employ feedback circuits from the load to the amplifier. However, it is a well recognized fact that when the amplifier is coupled to its load by means of an output transformer, the phase shift and time constants of the circuit limit the effectiveness and the magnitude of the feedback that may be employed and limit the correcting influence of the amplifier on the load or limit the damping that results from the use of feedback from the load to the amplifier.

Therefore, in view of the foreging it will be apparent that it is desirable to eliminate the need for an output transformer in an amplifier which is intended to supply undistorted audio frequency power to loads such as loudspeakers, recording heads and the like. Accordingly, it is an object of this invention to provide an electronic power amplifier for supplying power to a low impedance load, in which the usual coupling transformer between the electron tubes and the load may be eliminated.

Another object of this invention is to provide an electronic power amplifier capable of supplying large amounts of power to low impedance loads in the frequency range extending from a fraction of a cycle to several million cycles per second.

Still another object of this invention is to provide an electronic power amplifier having an inherent negative feedback characteristic in which the load forms a portion of the feedback loop.

Another object of this invention is to provide an electronic power amplifier in which large amounts of feedback may be employed so as to obtain essentially undistorted output voltages.

Another object of this invention is to provide an electronic power amplifier which especially provides highly effective damping of low impedance loads when supplying power in the region of the low audio frequency range.

Another object of this invention is to provide an electronic power amplifier in which the relatively small voltage drop across the low impedance load results in relatively small variations in the anode voltage of the electron discharge devices thereby permitting the amplifier to supply large peak output currents to the load.

Another object of this invention is to provide an electronic power amplifier in which the dynamic plate resistance characteristic of vacuum tubes is utilized in such manner that their resistance is lowest at times when maximum current is delivered to the load thereby achieving a ratio of instantaneous plate resistance to load impedance that approximates unity so that the amplifier is capable of supplying large peak output power to the load.

Another object of this invention is to provide an electronic power amplifier in which no current flows through the associated load impedance in the absence of an input signal.

Another object of my invention is to provide an electronic power amplifier which, with a particular input signal, provides an essentially constant output voltage to a wide range of load impedances.

Another object of this invention is to provide an electronic power amplifier which is relatively inexpensive as compared to a conventional type amplifier that is capable of supplying a comparable amount of undistorted peak power to a low impedance load.

Other objects of this invention as well as advantages and features of novelty thereof will be apparent from the following description taken in connection with the accompanying drawings.

Briefly described this invention is an electronic power amplifier wherein a first and a second electron discharge device are connected in series insofar as their anode circuits are concerned and to a source of direct current energy, their contol electrodes are supplied with oppositely phased signal voltages, and a low impedance load in connected in multiple with the two electron discharge devices. In a first mode of operation of the two electron discharge devices, the associated circuits are arranged and proportioned so that with oppositely phased signal voltages of equal magnitudes supplied to the control electrodes, there is delivered undistorted power to a low impedance load. In a second mode of operation of the two electron discharge devices, the associated circuits are arranged and proportioned so that with oppositely phased signal voltages of unequal magnitudes supplied to the control electrodes, there is delivered somewhat greater power to a low impedance load than that obtainable with the first mode. In a third mode of operation of the two electron discharge devices, the associated circuits are arranged and proportioned so that with oppositely phased signal voltages of equal magnitudes supplied to the control electrodes, a portion of the voltage developed across the load is applied to increase the signal voltage supplied to one of the control electrodes, and to decrease the signal voltage supplied to the other control electrode so that greater power is delivered to a low impedance load than that obtainable with the first mode.

This disclosure describes several forms of electronic power amplifier embodying this invention and the novel features thereof are also brought out in the claims.

In the accompanying drawings.

Figure 1:
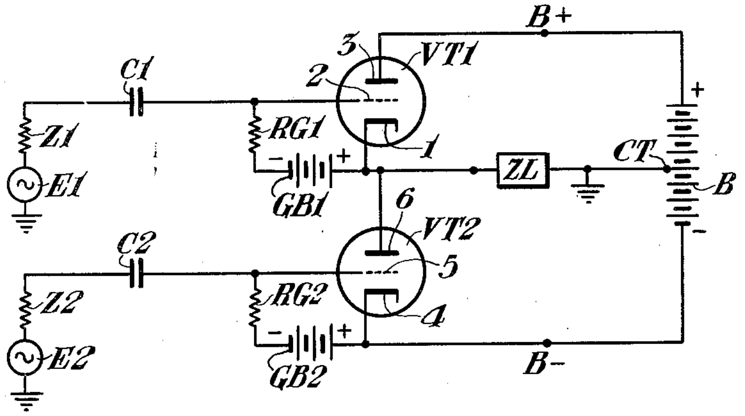
Fig. 1 is a diagrammatic view showing one form of an electronic power amplifier embodying this invention.

Referring to Fig. 1 there is shown a first electron discharge device or vacuum tube VT1 having at least an anode 3, a cathode 1 and a control electrode or grid 2, and a second electron discharge device or vacuum tube VT2 also having at least an anode 6, a cathode 4, and a control electrode or grid 5. Tubes VT1 and VT2 are preferably of the type having relatively low alternating current plate resistance and high transconductance. In the circuit arrangement embodying the invention hereinafter described, tubes VT1 and VT2 have similar electrical characteristics, however, it will be apparent to those skilled in the art that dissimiliar tubes may be made to function in this circuit arrangement. Furthermore, tubes VT1 and VT2 may be of the well known type wherein dual triode elements are enclosed in a single envelope, or tubes VT1 and VT2, while each is here shown as a single triode, may be each two or more triodes having their elements connected in multiple.

A source of direct current energy having relatively small internal impedance is herein conventionally illustrated as a battery B in order to simplify the drawing. In the embodiment of the invention hereinafter described the source of direct current energy, battery B, supplies suitable anode voltage and current to the series connected tubes VT1 and VT2, and is provided with a positive terminal B+, a negative terminal B— and an intermediate tap CT, which tap provides two equal and opposite voltages between the terminals CT and B+, and CT and B—. It will later be shown that in practicing this invention the intermediate tap CT does not have to be an exact center tap of the source of direct current energy, and furthermore, a source of direct current energy not having an intermediate tap may be employed.

The anode 3 of tube VT1 is connected to the positive terminal B+ of battery B, the cathode 1 of tube VT1 is connected to the anode 6 of tube VT2, and the cathode 4 of tube VT2 is connected to the negative terminal B— of battery B. A bias battery GB1 is connected between the cathode 1 and the control electrode 2 of tube VT1 by means of a grid resistor RG1, and tube VT2 is similarly biased by means of battery GB2 and the grid resistor RG2. The voltages of batteries GB1 and GB2 are proportioned so as to bias tubes VT1 and VT2, respectively, to provide approximately class A operation of each of the tubes as will be described hereinafter. There are a variety of well known methods of providing biasing potentials for vacuum tubes, and it is to be understood that my invention is not limited to the manner herein shown.

It will now be seen that the cathode to anode space of the tube VT2 and the cathode to anode space of tube VT1 are connected in series across the terminals B— and B+ of battery B, and accordingly a resting current will flow through this circuit. Since the two similar vacuum tubes VT1 and VT2 are each biased by similar biasing potentials, the effective impedances of their cathode to anode spaces will be essentially equal, and thus the magnitude of the voltage appearing across the cathode to anode space of each tube will be equal to one-half of the voltage appearing across the terminals B— and B+ of battery B.

A low impedance load ZL which may be a loudspeaker, recording head, or the like is connected between the junction of the cathode 1 of tube VT1 and the anode 6 of tube VT2, and the intermediate tap CT of battery B. It can now be seen that the parts in this circuit arrangement have been so arranged and proportioned that there is no potential difference across the terminals of the load impedance ZL and accordingly there is no current flow through the load impedance ZL. This circuit arrangement can be considered as balanced when in the absence of an input signal to the circuit arrangement, there is no current flow through the load impedance ZL. It will be obvious to those skilled in the art, that when conventional type vacuum tubes are employed in this circuit arrangement, tubes VT1 and VT2 will not necessarily have identical electrical characteristics, and thus the biasing potential applied to one of the tubes may be made slightly larger or smaller than the biasing potential applied to the other tube so as to arrive at the balanced condition. Furthermore, it will be obvious, that if the intermediate tap CT of the source of direct current energy provides two voltages that are of slightly different magnitudes rather than two voltages having exactly the same magnitudes, the biasing potentials may be adjusted so as to arrive at the balanced condition.

In order to cause a current to flow through the load impedance ZL and thereby transfer power to the load, signal voltages are applied to the control electrodes of tubes VT1 and VT2 thereby disrupting the balanced condition previously described. A first source of signal voltage is conventionally illustrated in Fig. 1 as a voltage generator E1 and a series impedance Z1 connected, by means of coupling capacitor C1 and a common ground connection, between the control electrode 2 of tube VT1 and the intermediate tap CT of battery B, respectively. A second source of signal voltage is similarly shown connected between the control electrode 5 of tube VT2 and the intermediate tap CT of battery B.

To analyze the operation of vacuum tubes in conventional circuits it is customary to replace the tube by an equivalent generator and impedance. However, the circuit subsequently to be described cannot readily be analyzed in the customary manner, therefore, for purposes of understanding the operation of this circuit, it is preferable to consider each tube as a variable resistance. That is, for a particular condition of anode voltage appearing across the cathode to anode space, and for a particular bias voltage which is applied to the control electrode with respect to the cathode thereby providing a predetermined operating point, there will be a specific current flow through the tube. Accordingly, the equivalent resistance of the tube can be calculated using Ohm's Law wherein the voltage is that which appears across the cathode to anode space, and the current is that which flows through the anode to cathode space. When a voltage applied to the control electrode with respect to the cathode changes in a positive direction thereby decreasing the bias on the tube, the tube becomes more conductive and thus the current flow through the cathode to anode space increases. If we assume that the voltage across the cathode to anode space remains constant, it accordingly follows that the effective resistance of the tube decreases due to the increase in current flow. Conversely, if a voltage applied to the control electrode with respect to the cathode increases in a negative direction, thereby increasing the bias voltage on the tube, the tube becomes less conductive and thus the current decreases so that the effective resistance of the tube increases.

In the circuit arrangement hereinafter described, it will be seen that the voltage across the cathode to anode space does not remain constant. Rather, the voltage across the cathode to anode space either decreases slightly when the voltage applied to the control electrode with respect to the cathode increases in a positive direction, or increases slightly when the voltage applied to the control electrode with respect to the cathode increases in a negative direction.

It is a well known characteristic of vacuum tubes that for a particular grid voltage, a decrease in the voltage across the cathode to anode space causes the current through the space to decrease, or conversely, an increase in the voltage across the cathode to anode space causes the current through the space to increase. It is therefore apparent that the above described changes in the voltage appearing across the cathode to anode space as a result of voltages applied to the control electrode with respect to the cathode lessen the change in the effective resistance of the tubes that would have been produced had the voltage appearing across the cathode to anode space remained constant. It is therefore obvious that if the changes in the voltage appearing across the cathode to anode space are small, there will be only a slight lessening of the change in the effective resistance of the tube that would have been produced had the voltage appearing across the cathode to anode space remained constant. From the subsequent description of this invention it will be seen that the voltage drop appearing across the load impedance ZL will be the same as the changes in the voltage appearing across the cathode to anode spaces of the tubes, however, as previously pointed out, the load has a low impedance, and therefore the voltage drop appearing across the load impedance as a result of signal voltages being applied to the control electrode of the tubes is relatively small as compared to the voltage appearing across the cathode to anode spaces of the tubes.

The foregoing considerations have disregarded the interelectrode capacitance of the tube, however, this is permissible for purposes of this analysis in that the equivalent resistance of the tubes used in this circuit is very low, and for the reactance of the interelectrode capacitance to be essentially of the same magnitude as the tube resistance, the frequency of the voltage applied to the control electrode would have to be in the upper radio frequency range. Thus, for audio frequencies and low radio frequencies, this capacitance can be neglected and the tube impedances can be considered as being variable resistances.

With the foregoing as a means of analyzing the operation of vacuum tubes, the operation of the circuit arrangement shown in Fig. 1 will now be considered. The signal voltages applied to the control electrodes 2 and 5 of tubes VT1 and VT2, respectively, are preferably essentially oppositely phased, or in other words the two signal voltages are essentially 180° out of phase one with respect to the other. Well known methods of obtaining such signal voltages are by means of phase inverter circuits, or by means of properly phased transformer windings. It can now be seen that when the signal voltage applied to the control electrode 2 of tube VT1 is increasing in a positive direction, the signal voltage applied to the control electrode 5 of tube VT2 will be increasing in a negative direction, and conversely, when the signal voltage applied to the control electrode 2 is increasing in a negative direction, the signal voltage applied to the control electrode 5 will be increasing in a positive direction. The result produced by these signal voltages is to cause an unbalance in the circuit arrangement so that in response to the signal voltages a current flows through the load impedance ZL. This becomes readily apparent when the tubes in this circuit arrangement are considered as being variable resistances. First the circuit operation will be considered when a signal voltage is applied only to tube VT2. As previously pointed out the second source of signal voltage is connected between the control electrode 5 of tube VT2 and the intermediate tap CT of battery B. Since the cathode 4 of tube VT2 is connected to the negative terminal B— of battery B, and battery B has a relatively small internal impedance, the signal voltage is thereby effectively applied to the control electrode 5 with respect to the cathode 4 of tube VT2. When the signal voltage applied to the control electrode 5 with respect to the cathode 4 of tube VT2 is increasing in a positive direction, the effective resistance of tube VT2 will be decreasing. However, as previously pointed out in balancing this circuit arrangement, the effective resistances of the two tubes VT1 and VT2 in the absence of signal voltages had been essentially equal and there was no current flow through the load impedance ZL. Now, when the effective resistance of tube VT2 decreases and using the positive to negative sense of current flow current will flow in the circuit that may be traced from the intermediate tap CT of battery B, through the load impedance ZL, through the effective resistance of tube VT2 to the negative terminal B— of battery B. As previously pointed out there is also a current flowing in the circuit that may be traced from the positive terminal B+ of battery B, through the effective resistance of tubes VT1 and VT2, to the negative terminal B— of battery B. When the effective resistance of tube VT2 is decreasing, the current flowing through it will comprise two components, one of which is the load current and the other is the series current flowing through the effective resistances of the two tubes in series. From this it can be seen that the load current is the difference in the current flowing through the two tubes. Also, since current is flowing through the load impedance ZL from the intermediate tap CT of battery B, the voltage at the junction of the effective resistances of the two tubes will be increasingly less positive than the intermediate tap CT, as the effective resistance of tube VT2 decreases.

As previously pointed out the first source of signal voltage is connected between the control electrode 2 of tube VT1 and the intermediate tap CT of battery B. It is evident that any change in the voltage appearing across the load impedance ZL is effectively coupled between the cathode 1 and the control electrode 2 of tube VT1 by means of the first source of signal voltage. Therefore, when the effective resistance of tube VT2 decreases, the voltage at the junction of the effective resistances of the two tubes will be increasingly less positive than the intermediate tap CT, or, in other words, the cathode 1 of tube VT1 is increasingly less positive than the intermediate tap CT, and this is the same as saying that a voltage which is effectively coupled to the control electrode 2 of tube VT1 with respect to its cathode 1, is increasing in a positive direction as a result of a signal voltage increasing in a positive direction applied to the control electrode 5 of tube VT2. Now it can be seen that when oppositely phased signal voltages are applied to the control electrodes of tubes VT1 and VT2 the signal voltage applied to the control electrode 2 of tube VT1 will be increasing in negative direction tending to nullify or even exceed the effective voltage coupled to the control electrode 2 of tube VT1 with respect to its cathode 1 as a result of a signal voltage increasing in a positive direction applied to the control electrode 5 of tube VT2. The extent to which this nullifying action takes place depends upon the characteristics of the tubes, the relative magnitudes of the signal voltages applied to the control electrodes of the two tubes, and the impedance of the load ZL.

Before considering the operation of the circuit when oppositely phased voltages are applied to the control electrodes of the two tubes, the circuit operation will be considered when a signal voltage which is increasing in a negative direction is applied only to tube VT2. When the signal voltage applied to the control electrode 5 with respect to the cathode 4 of tube VT2, is increasing in a negative direction the effective resistance of tube VT2 will be increasing and less current will tend to flow through the effective resistance of tube VT2. Accordingly, the current flowing in the circuit that may be traced from the positive terminal B+ of battery B, through the effective resistances of tubes VT1 and VT2 to the negative terminal B— of battery B will be decreasing and thus a current will flow in the circuit that may be traced from the positive terminal B+ of battery B, through the effective resistance of tube VT1, through the load impedance ZL to the intermediate tap CT of battery B. Thus it can be seen that when the effective resistance of tube VT2 is increasing, the current flowing through tube VT1 will comprise two components, one of which is the load current and the other is the series current flowing through the series effective resistances of the two tubes. Again it can be seen that the load current is the difference in the currents flowing through the two tubes, and furthermore the load current now flows through the load impedance ZL in a direction opposite to its direction when the signal voltage which was increasing in a positive direction was applied only to tube VT2. Also, since current is flowing through the load impedance ZL to the intermediate tap CT of battery B, the voltage at the junction of the effective resistances of the two tubes will be increasingly more positive than the intermediate tap CT, as the effective resistance of tube VT2 increases, and a voltage which is effectively coupled to the control electrode 2 of tube VT1 with respect to its cathode 1 is increasing in a negative direction as a result of a signal voltage increasing in a negative direction applied to the control electrode 5 of tube VT2. Again it can be seen that when oppositely phased signal voltages are applied to the control electrodes of tubes VT1 and VT2, the signal voltage applied to the control electrode 2 of tube VT1 will be increasing in a positive direction tending to nullify or even exceed the effective voltage coupled to the control electrode 2 of tube VT1 with respect to its cathode 1 as a result of a signal voltage increasing in a negative direction applied to the control electrode 5 of tube VT2.

A first mode of operation of this circuit arrangement is when oppositely phased signal voltages of essentially the same magnitude are applied to the control electrodes 2 and 5 of tubes VT1 and VT2, respectively. With this mode of operation it has been found that when the tubes VT1 and VT2 are of the type having relatively low alternating current plate resistance and high transconductance, and the load ZL has a low impedance as compared to the effective resistance of the tubes, the signal voltages applied to the control electrode 2 of tube VT1 will substantially nullify the effective voltage coupled to the control electrode 2 as a result of a signal voltage applied to the control electrode 5 of tube VT2. Accordingly, it is obvious that the resistance of tube VT1 remains substantially constant and the variations in the resistance of tube VT2 result in a current flow through, and a voltage drop across the load impedance ZL. However, if the voltage drop across the load impedance ZL should not tend to vary in proportion to the signal voltage applied to the control electrode of tube VT2, the nullifying action produced by the signal voltage applied to the control electrode of tube VT1 is increased or decreased in such manner that the voltage drop across the load impedance ZL tends to vary in proportion to the signal voltages. Thus, it is apparent that with this mode of operation, the load current is produced principally due to variations in the resistance of tube VT2, and that tube VT1 is primarily effective in maintaining the load voltage proportional to the signal voltages. This circuit arrangement has been found to be ideally suited for supplying power to loads such as loudspeakers, recording heads and the like.

In view of the foregoing description of the first mode of operation of this circuit arrangement, it is apparent that greater power output and efficiency can be obtained if tube VT1 is to not only provide linear operation of the circuit arrangement, but also contribute in supplying power to the load. Accordingly, a second mode of operation of the circuit arrangement is when oppositely phased signal voltages are applied to the control electrodes 2 and 5 of tubes VT1 and VT2, respectively, and the magnitude of the signal voltage applied to the control electrode of tube VT1 is proportionally greater than the signal voltage applied to the control electrode of tube VT2 so that the magnitudes of the variations in the resistance of tubes VT1 and VT2 are substantially equal. Since, as previously explained, the variations in the resistance of a tube in this circuit arrangement are controlled by the signal voltage applied to its control electrode with respect to its cathode, it will be readily apparent that with this second mode of operation the magnitude of the signal voltage applied to the control electrode 2 with respect to the cathode 1 of tube VT1 is equal in magnitude and oppositely phased to the signal voltage applied to the control electrode 5 with respect to the cathode 4 of tube VT2. However, since the first source of signal voltage E1, as here shown and previously described is connected between the control electrode 2 of tube VT1 and the intermediate tap CT of battery B, and the voltage developed across the load impedance ZL as a result of signal voltages applied to the control electrodes of the two tubes tends to nullify a portion of the effect of the first source of signal voltage, the magnitude of the voltage produced by the first source of signal voltage E1 must be greater than the magnitude of the voltage produced by the second source of signal voltage E2 by an amount equal to the magnitude of the voltage developed across the load impedance ZL. Furthermore, since the voltage developed across the load impedance ZL is proportional to the resistance variations of tubes VT1 and VT2, and the resistance variations are substantially proportional to the voltages applied to the control electrodes with respect to the cathodes of the tubes, it can be seen that with this second mode of operation the voltage produced by the first source of signal voltage E1 and applied to the control electrode 2 of tube VT1 is proportionally greater than the signal produced by the second source of signal voltage E2 and applied to the control electrode 5 of tube VT2. It has been found that when the tubes VT1 and VT2 are of the type having a relatively low alternating current plate resistance and high transconductance, and the load ZL has a low impedance as compared to the effective resistance of the tubes, the proper ratio of proportionality between the magnitudes of the oppositely phased voltages produced by the two sources of signal voltage is approximately 2 to 1. It will now be obvious to those skilled in the art that depending upon the particular impedance of the load and the characteristics of the tubes employed, the proper ratio of proportionality between the magnitudes of the signal voltages may readily be determined, and that this invention is not limited to any particular ratio. When there are variations in the impedance of the load, such as the variations in the impedance of a conventional loudspeaker at various frequencies, with a particular ratio of proportionality between the magnitudes of the signal voltages, the magnitude of the voltage developed across the load impedance varies substantially as the impedance of the load varies. In such applications it is very desirable to apply multi-stage inverse feedback to this circuit arrangement so as to maintain the voltage developed across the load impedance proportional to the signal voltage. One method of applying multi-stage inverse feedback to this circuit arrangement is shown in Fig. 4.

Figure 4:
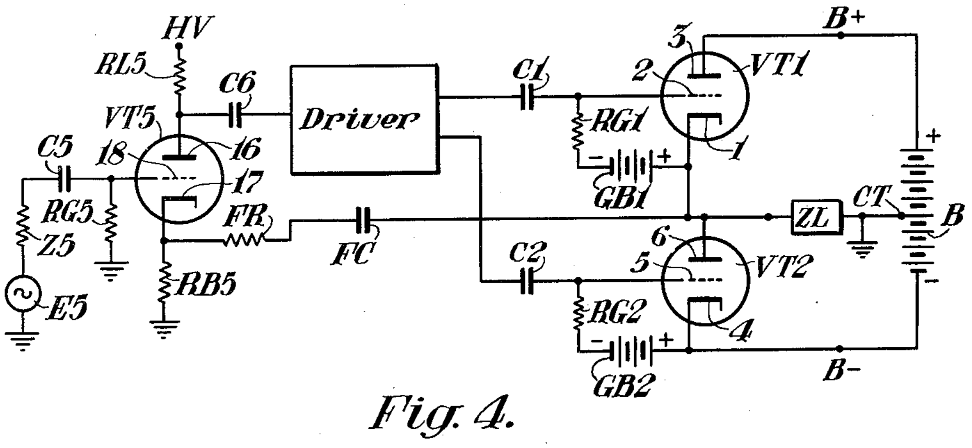
Fig. 4 is a diagrammatic view showing still another form of an electronic power amplifier embodying this invention and the application thereto of multistage inverse feedback.

In Fig. 4 there is shown an electron discharge device or vacuum tube VT5 which is preferably a conventional triode voltage amplifier tube having at least an anode 16, a cathode 17 and a control electrode or grid 18. A source of signal voltage is conventionally illustrated as a voltage generator E5 and a series impedance Z5 and is connected by means of coupling capacitor C5 between the control electrode 18 of tube VT5 and ground. The cathode to anode impedance of tube VT5 is connected in a circuit which may be traced from terminal HV, through the anode load resistor RL5, through the anode to cathode space of tube VT5, and through biasing resistor RB5 to ground. A suitable source of direct current energy, not shown in order to simplify the drawing, having a positive terminal and a negative terminal connected between terminals HV, and ground, respectively, is provided to supply suitable current to the signal voltage amplifier tube VT5. Biasing resistor RB5 is chosen to have such a value of resistance that the control electrode 18 of tube VT5 is biased with respect to the cathode 17, by means of grid resistor RG5 connected between the control electrode 18 and ground, so as to provide essentially class A operation of the tube which is well known and understood by those skilled in the art. Accordingly, tube VT5 and the foregoing associated circuit components function as a conventional voltage amplifier stage wherein varying voltages proportional to the signal voltage appear across the un-bypassed cathode biasing resistor RB5 and the anode load resistor RL5. The varying voltage which appears across the anode load resistor RL5 is coupled by means of a suitable coupling capacitor C6 to a "driver" which supplies oppositely phased voltages of suitable magnitudes to the control electrodes 2 and 5 of tubes VT1 and VT2 by means of coupling capacitors C1 and C2, respectively. The varying voltage which thereby appears across the load impedance ZL is coupled to a feedback circuit which is here shown comprising a feedback capacitor FC and a feedback resistor FR. The feedback capacitor FC is chosen to have negligible impedance to the varying voltage appearing across the load impedance as compared to the sum of the impedances of resistors FR and RB5. Resistors FR and RB5 are connected in series so as to provide a voltage divider circuit by means of which a portion of the voltage which appears across the load impedance will appear across resistor RB5. Obviously, when the impedance of resistor FR is large, the feedback voltage appearing across resistor RB5 will be small as compared to the voltage appearing across the load impedance ZL and by reducing the impedance of resistor FR, greater feedback is obtained. Furthermore, to obtain inverse feedback, the feedback voltage applied to resistor RB5 must be "in phase" with the voltage that appears across resistor RB5 as a result of signal voltage variations applied to the control electrode 18 of tube VT5. This condition is obtained when the voltage supplied to the control electrode 5 of tube VT2 by the "driver," is in phase with the voltage supplied to the "driver" by means of coupling capacitor C6.

With the foregoing multistage inverse feedback, the voltage that appears across the load impedance will be substantially proportional to the magnitude of the signal voltage produced by the source E5. This and several other methods of applying feedback voltage to voltage amplifier stages are well known in the art and a complete description of the operation of the feedback circuits appears to be unwarranted. It is well known that voltage feedback may be employed in order to obtain what is known as constant voltage output, and it is herein utilized in the usual manner.

Figure 2:
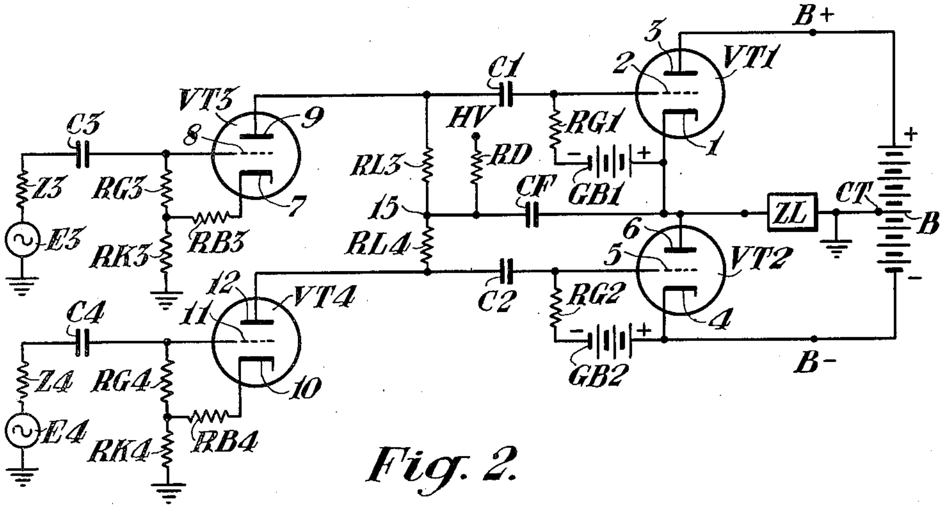
Fig. 2 is also a diagrammatic view showing another form of an electronic power amplifier embodying this invention.

A third mode of operation of this circuit arrangement includes a feedback circuit which tends to automatically adjust the ratio of proportionality between the oppositely phased signal voltages applied to the control electrodes 2 and 5 of tubes VT1 and VT2, respectively, so that the magnitudes of the variations in the resistance of tubes VT1 and VT2 are substantially equal. A method by which this mode of operation can be obtained is shown in Fig. 2, wherein a regenerative-degenerative feedback cricuit is employed which effectively increases the magnitude of the signal voltage that would otherwise have been applied to the control electrode 2 of tube VT1 and at the same time decreases the magnitude of the signal voltage that would otherwise have been applied to control electrode 5 of tube VT2 so that the desired ratio of proportionality between the then applied oppositely phased signal voltages is obtained. As here shown a first source of signal voltage is conventionally illustrated as a voltage generator E3 and a series impedance Z3 connected by means of coupling capacitor C3 between the control electrode 8 of tube VT3 and ground. Tube VT3 is a conventional triode voltage amplifier tube having a cathode 7, a control electrode 8, and an anode 9. The cathode to anode impedance of tube VT3 is connected in a circuit which may be traced from terminal HV, through decoupling resistor RD, through the anode load resistor RL3, through the anode to cathode space of tube VT3, through the biasing resistor RB3 and through the cathode load resistor RK3 to ground. A suitable source of direct current energy, not shown in order to simplify the drawings, having a positive and a negative terminal connected between terminal HV and ground, respectively, is provided to supply suitable current to the signal voltage amplifier tubes VT3 and VT4. Biasing resistor RB3 is chosen to have such a value of resistance that the control electrode 8 of tube VT3 is biased with respect to the cathode 7 by means of grid resistor RG3 connected between the control electrode 8 and the junction of resistors RB3 and RK3, so as to provide essentially class A operation of the tube which is well known and understood by those skilled in the art. Tube VT4 is similar to tube VT3 and tube VT4 is connected to similar circuit components which are designated by the suffix reference character 4. A feedback capacitor CF is shown connected between the junction of cathode 1 of tube VT1 and the anode 6 of tube VT2, and the junction designated by reference character 15, of the anode load resistors RL3 and RL4 of tubes VT3 and VT4, respectively. Or, stated in another manner, feedback capacitor CF is shown connected between the ungrounded terminal of the load impedance ZL and the junction 15. The remaining circuit elements shown in Fig. 2 have the same reference characters as shown on Fig. 1 and refer to the similar parts previously described.

In order to describe the operation of this circuit arrangement, it will first be assumed that the feedback capacitor CF is not connected to the circuit and the operation of the circuit arrangement will now be described, and subsequently, the operation of this circuit arrangement will be described with the feedback capacitor CF connected as shown.

The signal voltages applied to the control electrodes 8 and 11 of tubes VT3 and VT4, respectively, from the sources of signal voltage E3 and E4, respectively, are preferably essentially oppositely phased and of essentially the same magnitude. The tubes VT3 and VT4 with their associated circuit elements function as conventional voltage amplifier stages so that the signal voltages which appear across their respective load resistors RL3 and RL4 are essentially oppositely phased and of essentially the same magnitude, and of greater magnitude than the signal voltages applied to the control electrodes of the tubes. Now it will be readily apparent that since the signal voltages which appear across the load resistors RL3 and RL4 are essentially oppositely phased and of essentially the same magnitude, the respective variations in the currents which flow through resistors RL3 and RL4 are essentially oppositely phased and of essentially the same magnitude. Therefore, since both the current which flows through resistor RL3 and the current which flows through resistor RL4 combine at the junction 15 and flow through the decoupling resistor RD, it is obvious that there is substantially no variation in the current flowing through resistor RD and consequently no signal voltage appears across the terminals of the decoupling resistor RD. The signal voltages which appear across the load resistors RL3 and RL4 are coupled by means of coupling condensers C1 and C2 to the control electrodes 2 and 5 of tubes VT1 and VT2, respectively, and accordingly the circuit arrangement comprising tubes VT1 and VT2 operates as previously described as the first mode of operation.

It will now be assumed that the feedback capacitor CF is connected to the circuit as shown in Fig. 2 and signal voltages are applied to the control electrodes 8 and 11 of tubes VT3 and VT4, respectively, from the sources of signal voltages E3 and E4, respectively, as previously described. It will be readily apparent that any signal voltage variations that appear across the terminals of the load impedance ZL will be coupled by means of the feedback capacitor CF to the junction 15. The signal voltage so coupled to junction 15 will hereinafter be referred to as the feedback voltage. Also, the current which flows through the feedback circuit as a result of the feedback voltage will hereinafter be referred to as the feedback current.

Referring to Fig. 2 it will be seen that the feedback current flows through three different circuits and, by means of the common ground connections to the grounded terminal of the load impedance ZL. The first of these paths is from the load impedance ZL, through feedback capacitor CF to junction 15, through resistor RL3, through the impedance of tube VT3, through resistor RB3, through resistor RK3, and by means of the common ground connections to the grounded terminal of load impedance ZL. The second path is from the load impedance ZL through feedback capacitor CF to junction 15, through resistor RL4, through the impedance of tube VT4, through resistor RB4, through resistor RK4, and by means of the common ground connections to the grounded terminal of load impedance ZL. The third path is from the load impedance ZL, through feedback capacitor CF to junction 15, through decoupling resistor RD, through the internal impedance of the source of direct current energy connected to terminal HV, and by means of the common ground connections to the grounded terminal of load impedance ZL.

A conventional source of direct current energy which may be connected between the terminals HV and ground ordinarily has a relatively low impedance, and therefore decoupling resistor RD is provided so as to prevent the source of direct current energy from tending to short circuit the feedback voltage appearing at junction 15. A suitable value of resistance for resistor RD is such that it is several times larger than the maximum impedance of the load ZL. Obviously, the feedback current is produced as a result of the variations in the resistances of tubes VT1 and VT2 and accordingly the feedback current is subtracting from the load current which would otherwise flow through the load impedance ZL. Therefore it is readily apparent that it is desirable that the magnitude of the feedback current be relatively small as compared to the magnitude of the load current and decoupling resistor RD is chosen so as to have a considerably larger value of resistance than the maximum impedance of the load ZL.

In view of the foregoing description of the functioning of decoupling resistor RD it will be obvious to those skilled in the art that a decoupling impedance such as reactor or choke may be employed, however, such decoupling impedances may produce an undesirable phase shift in the feedback voltage at various frequencies and therefore a decoupling resistor is preferable.

It can now be seen that the feedback capacitor CF is so chosen as to have a relatively low impedance to the signal voltage which is coupled from the ungrounded terminal of the load impedance ZL to junction 15. Furthermore, it is highly desirable that there be negligible phase shift in the feedback circuit and therefore the feedback capacitor CF must have a relatively low impedance to the signal voltage as compared to the impedance of the feedback circuit from the junction 15 to ground.

The functioning of the feedback circuit with respect to the first and second paths including tubes VT3 and VT4, respectively, can be considered in either of two different manners. In the first manner, the path from junction 15 to ground comprising the various resistors in series with the tube impedance can be considered as a voltage divider circuit and the feedback voltage which appears between the anodes of the tubes and ground is coupled to the control electrodes of tubes VT1 and VT2. That is, when feedback voltage is coupled by capacitor CF to junction 15, feedback current flows through the first path that may be traced from junction 15, through resistor RL3, through the impedance of tube VT3, through resistor RB3 and through resistor RK3 to ground. The feedback voltage which appears between the anode 9 of tube VT3 and ground as a result of this feedback current, is coupled by means of capacitor C1 to the control electrode 2 of tube VT1. In the foregoing description of the first mode of operation it was pointed out that when signal voltages were applied to the control electrodes 2 and 5 of tube VT1 and VT2, respectively, the voltage developed across the load impedance ZL was of essentially the same magnitude as the signal voltage applied to the control electrode 2 of tube VT1 and accordingly there was essentially no change in the resistance of tube VT1 as a result of essentially no potential difference between the control electrode 2 and cathode 1 of tube VT1. Now it can be seen that a portion of the signal voltage appearing across the load impedance ZL is applied to the control electrode 2 by means of the feedback circuit, and this feedback voltage will add to the signal voltage applied to the control eelctrode 2 of tube VT1. Thus the signal voltage applied to the control electrode 2 of tube VT1 with respect to ground is increased.

It will be readily apparent to those skilled in the art that the effective impedance of tube VT3 is dependent upon not only the characteristic of the tube but also the effect of the unby-passed resistors RB3 and RK3 which tend to increase the effective impedance of tube VT3. It is well known that in a conventional voltage amplifier stage the effective impedance of the tube is usually relatively low as compared to the anode load resistor. In this circuit the usual value of anode load resistance may be employed for RL3, the usual value of resistance for biasing the tube may be employed for RB3, and the resistance of RK3 is so chosen as to increase the effective impedance of the tube VT3 so that the desired amount of increase in the signal voltage applied to the control electrode 2 of tube VT1 is obtained.

Due to the symmetry of the two feedback circuits comprising tubes VT3 and VT4 and since the various corresponding elements in the two circuits are substantially identical the operation of the feedback circuit comprising tube VT4 will be readily apparent. It should be pointed out, however, that since the signal voltage applied to the control electrode 11 of tube VT4 is oppositely phased with respect to the voltage applied to the control electrode 8 of tube VT3, the effect of the feedback voltage in the second path is to decrease rather than increase the signal voltage applied to the control electrode 5 of tube VT2.

In view of the foregoing description of the operation of the feedback circuits it will be obvious that the values of the resistance of resistors RK3 and RK4 are chosen so that the feedback voltage is effective in increasing the signal voltage applied to the control electrode 2 of tube VT1 and at the same time decreasing the signal voltage applied to the control electrode 5 of tube VT2 so that the desired ratio of proportionality between the oppositely phased signal voltages applied to the control electrodes 2 and 5 of tubes VT1 and VT2, respectively, is obtained and the magnitudes of the variations in the resistance of tubes VT1 and VT2 are substantially equal.

Figure 5:
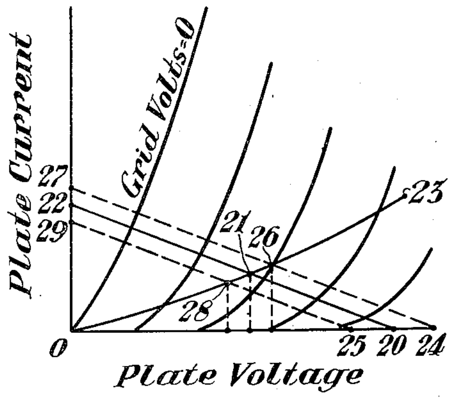
Fig. 5 shows the plate characterictic curves of a typical triode voltage amplifier tube.

The foregoing description of the first manner of considering the functioning of the feedback circuit appears to be adequate for an understanding of this third mode of operation of the circuit arrangement, however, for the technician skilled in the art, the more technical subsequent description will be most helpful. In Fig. 5 there are shown the plate characteristics of a typical triode voltage amplifier tube. The line 20—21—22 is constructed to represent the resistance of the load and the voltage at 20 is the voltage supplied to the load resistance. The line 0—21—23 is constructed to represent the bias voltage produced by the cathode biasing resistor. The point 21 is referred to as the operating point and represents both the bias of the tube and the voltage that appears between the anode of the tube and ground in the absence of signal voltages applied to the control electrode of the tube. When signal voltages are applied to the control electrode of the tube the bias voltage varies and accordingly the voltage appearing between the anode of the tube and ground varies. Observing such variation by the use of plate characteristic curves of an amplifier tube is fundamental knowledge to the technician skilled in the art.

In the foregoing description of the operation of the feedback capacitor it was pointed out that the voltage variations appearing across the terminals of the load impedance ZL were coupled by means of the feedback capacitor CF to the junction 15. Since the load resistors RL3 and RL4 are connected to junction 15, the feedback voltage will increase or decrease the voltage supplied to these load resistors. Such voltage changes are shown in Fig. 5 where the voltage at point 20 represents the voltage normally appearing at junction 15, and the voltage at points 24 and 25 represent respectively an increase and a decrease in this voltage as a result of a particular feedback voltage. For these supply voltages the load lines are shown dashed and represented by the lines 24—26—27 and 25—28—29. If for the moment it is assumed that no signal voltage is applied to the tube, the intersection of these load lines with the biasing resistor line 0—21—23 at points 26 and 28 shows the change in the voltage appearing between the anode of the tube and ground as a result of the feedback voltage variations. The dotted vertical lines from points 28, 21 and 26 more clearly indicate the anode voltage variations as a result of feedback voltage. Now it will be readily apparent to those skilled in the art that when signal voltages are applied to the control electrode of the tube, the voltage appearing between the anode and ground may, in one case, be increased as a result of the feedback voltage and in the other case be decreased as a result of the feedback voltage.

Now applying the foregoing analysis of voltage amplifier operation to the circuit shown in Fig. 2, it will be readily apparent to those skilled in the art that the voltage feedback arrangement comprising capacitor CF and decoupling resistor RD effectively causes the signal voltage applied to the control electrode 2 of tube VT1 to be increased and the signal voltage applied to the control electrode 5 of tube VT2 to be decreased. Also the effect of resistor RB3 and RK3 and RB4 and RK4 alters the effective plate characteristic curves of a voltage amplifier stage so that the signal voltages applied to the control electrodes 8 and 11 of tubes VT3 and VT4, respectively, are less effective in producing, anode voltage variation and accordingly the feedback voltage variations have a greater effect on the anode voltage variations. It is therefore again readily apparent that resistors RK3 and RK4 are chosen so that the feedback voltage is effective in increasing the signal voltage applied to the control electrode 2 of tube VT1 and at the same time, decreasing the signal voltage applied to the control electrode 5 of tube VT2 so that the desired ratio of proportionality between the oppositely phased signal voltages applied to the control electrodes 2 and 5 of tubes VT1 and VT2, respectively, is obtained and the magnitudes of the variations in the resistance of tubes VT1 and VT2 are substantially equal.

It will be noted that with this third mode of operation of the circuit arrangement, multistage inverse feedback may be employed in any of the conventional manners well known in the art, an example having been previously described with respect to Fig. 4. It will be remembered that the "driver" shown in Fig. 4, supplied oppositely phased voltages of suitable magnitudes to the control electrodes 2 and 5 of tubes VT1 and VT2 by means of coupling capacitors C1 and C2, respectively. Such a "driver" may comprise tubes VT3 and VT4 so as to supply suitable voltages to the control electrodes 2 and 5 of tubes VT1 and VT2.

Figure 6:
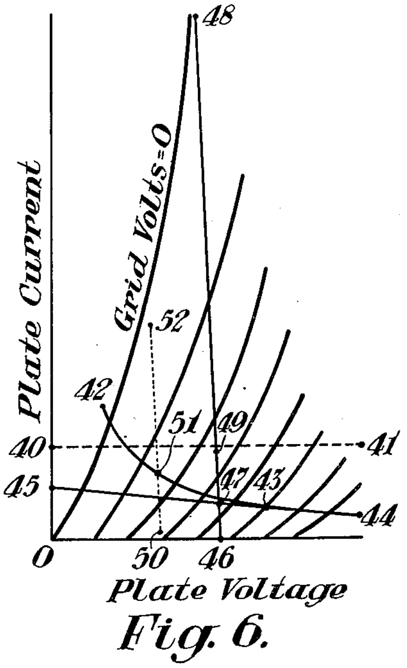
Fig. 6 shows the plate characteristic curves of a typical triode power amplifier tube.

It was previously pointed out that tubes VT1 and VT2 are biased to provide approximately class A operation of each of the tubes. Since a relatively low load impedance is employed with this circuit arrangement, the tubes may be biased such that the tubes operate approximately class A when relatively small amounts of power are being delivered to the load, and operate class AB when large peaks or pulses of power are being delivered to the load. The foregoing will become apparent from an alaysis of Fig. 6 which shows the plate characteristic curves of a typical triode power amplifier tube having a relatively low plate impedance and high transconductance. The portion of the curves below the dashed line 40—41 is usually shown on tube manufacturers design data sheets, however, for the type of tube operation subsequently to be described additional data for extending these curves as shown is desirable.

The curved line 42—43—44 represents the maximum plate power dissipation rating of the tube. That is, the maximum continuous plate voltage and corresponding plate current that the tube manufacturers recommend be applied to the tube. The line 45—43—44 represents the conventional load line for a load impedance several times larger than the plate resistance of the tube and point 43 is a satisfactory operating point when such a load is employed. Methods for determining such operating points and desirable load impedances are well known to those skilled in the art.

However, with the circuit arrangement hereinbefore described low impedance loads are employed, such a load being represented by load line 46—47—48. It will be noted that a typical load line of this type is almost vertical. Point 47 on the load line represents a suitable operating point for such a load, and with suitable signal voltages applied to the control electrode of the tube, the plate current may vary in the range between points 49 and 46. Plate current variations in the range from points 49 to 46 with point 47 as the operating point can be considered as approximately class A operation.

From an inspection of the plate characteristic curves it is obvious that if only approximately class A operation is to be employed, greater current variations are obtainable when an operating point such as point 51 is selected and the resulting load line is here represented by the dotted line 50—51—52. That is the current variations between points 50 and 52 with point 51 as an operating point are greater than the current variations between points 46 and 49 with point 47 as an operating point. However, by selecting an operating point such as point 47, the tube operates class A for moderate current variations such as in the range from points 49 to 46, and the tube operates class A B for very large current variations such as in the range from point 48 to 46.

It can be seen that if the signal voltage applied to the control electrode of the tube is of sufficient magnitude to cause the plate current of the tube to vary continuously between points 48 and 46 with an operating point such as point 47, the average plate current is greater than the current indicated where the maximum plate power dissipation curved line 42—43—44 intersects the load line. Accordingly continuous operation at such an average plate current would exceed the tube manufacturers recommended maximum dissipation value and might be harmful to the tube. Therefore it is undesirable to operate a tube continuously with such a large signal voltage applied to its control electrode. However, by selecting an operating point such as point 47, the average plate current of the tube is below the plate power dissipation curve when the plate current varies in the range between points 46 and 49, and momentarily the plate current can vary as much as between points 46 and 48 without exceeding the average plate power dissipation rating of the tube.

The foregoing can better be understood by means of an example wherein its use is desirable. That is, in audio amplifiers for speech sounds and music. It is a well known fact that while the average power that an amplifier may deliver to a loudspeaker load when it is reproducing speech sounds or music is relatively small, the instantaneous peaks or pulses of power necessary for faithful reproduction are extremely large as compared to the average power. Therefore, it will be seen that it may be desirable to select an operating point for the power output tubes of an amplifier so that the tubes are capable of delivering adequate average power to the loudspeaker, and at the same time are capable of delivering extremely large instantaneous peaks or pulses of power to the load. Such an operating point is shown as point 47 on Fig. 6.

Figure 3:
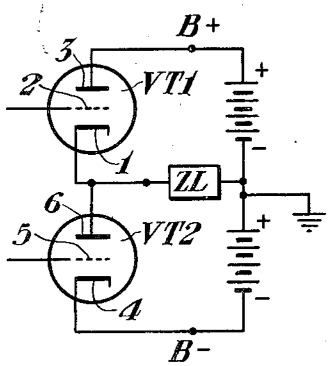
Fig. 3 is a diagrammatic view showing a power supply that may be employed with an electronic power amplifier embodying this invention.
Figure 7:
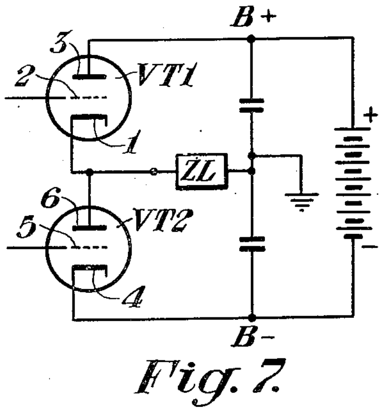
Fig. 7 is a diagrammatic view showing a power supply that may be employed with an electronic power amplifier embodying this invention.

It will be remembered from the foregoing explanation of the operation of tubes VT1 and VT2 that a source of direct current energy, illustrated as a battery B in Fig. 1, having a positive terminal B+, a negative terminal B—, and an intermediate tap CT supplied suitable anode voltage and current to the series connected tubes VT1 and VT2. In Figs. 3 and 7, there are shown two other sources of direct current energy which may be employed to supply suitable anode voltage and current to the series connected tubes VT1 and VT2. In Fig. 3, there is shown two similar sources of direct current energy that are connected in series so as to provide a positive terminal B+, a negative terminal B— and an intermediate tap at the junction of the two sources. In Fig. 7, there is shown a source of direct current energy having a positive terminal B+ and a negative terminal B—, and two capacitors which are connected in series across the B+ and B— terminals. The load impedance ZL is connected to the junction between the two series connected capacitors and accordingly the alternating current which will flow through the load impedance ZL as a result of alternating current signal voltages applied to the control electrodes of tubes VT1 and VT2, will alternately be supplied by one or the other of the two capacitors. Each of the two capacitors preferably has sufficient capacitance to be capable of supplying the necessary current to the load impedance ZL without an appreciable decrease in the voltage appearing across the capacitor.

It is to be understood that this invention is not limited to the specific embodiments shown herein. It will be appreciated by those skilled in the art that this invention is not limited to use in audio amplifiers with loudspeaker loads, but that it may be used in amplifiers for other purposes were it desirable to connect a low impedance load to an amplifier without using a coupling transformer. Moreover, direct coupling may be employed in connecting the sources of signal voltage to the amplifier so as to eliminate the conventional coupling condensers, thereby providing a power amplifier for direct current signal voltages.

I claim:

1. In combination with an amplifier comprising a pair of electron tubes each having input and output electrodes, the output electrodes being connected in circuit with a single ended load one terminal of which is grounded; a voltage gain driver stage comprising a first and a second electron discharge device each having an anode, a cathode and a control electrode, a first and a second anode resistor, a first and a second pair of cathode resistors, a first and a second control electrode resistor, a decoupling resistor, a direct current source having one terminal grounded, a feed-back capacitor; a first anode circuit including in series said source, said decoupling resistor, said first anode resistor, anode to cathode space of said first device, said first pair of cathode resistors and ground; a second anode circuit including in series said source, said decoupling resistor, said second anode resistor, anode to cathode space of said second device, said second pair of cathode resistors and ground; said first control electrode resistor with connections to the control electrode of said first device and the junction of said first pair of cathode resistors, said second control electrode resistor with connections to the control electrode of said second device and the junction of said second pair of cathode resistors, said feed-back capictor with connection to the ungrounded terminal of said load and the junction of said decoupling resistor and said first and second anode resistors, a first coupling circuit including a capacitor with connection to the first device anode and the input terminals of said first one of said tubes, a second coupling circuit including a capacitor with connection to the second device anode and the input terminal of the second one of said tubes, and signal voltage source means to excite the devices with oppositely phased signal voltages connected to the respective control electrodes of said first and second devices.

2. In an amplifying system, the combination of a single ended output stage for push pull input signals comprising a first and a second electron discharge device each with at least an anode, a cathode and a control electrode, the anode to cathode paths of said first and second devices in a series circuit with a source of direct current energy and a load, the anode of said first device and the cathode of said second device so coupled to each other and to the load that the same output signal potential is developed at each with respect to ground, the cathode of said first device and the anode of said second device coupled to each other and to said ground, means for biasing the control electrode to the cathode of each of said first and second devices respectively, a voltage gain driver system comprising a third and a fourth electron discharge device each having at least an anode, a cathode and a control electrode, two anode resistors, two cathode resistors, said cathode resistors connected in series between the cathodes of said third and fourth devices, said anode resistors connected in series between the anodes of said third and fourth devices, the junction of said cathode resistors connected to said ground, means to supply direct current to the junction of said anode resistors and to the junction of said cathode resistors and coupling said junction of anode resistors to a point having signal output potential, the anodes of said third and fourth devices coupled to the control electrodes of said first and second devices, means for biasing the control electrodes with respect to the cathodes of each of said third and fourth devices respectively, and signal voltage source means for supplying oppositely phased signals to the respective control electrodes of said third and fourth devices.

3. An amplifier including in combintion, a first and a second electron discharge tube each having an anode, a cathode and a control electrode; a first and a second source of direct current energy, a load, a ring circuit having the anode of said first tube connected to the positive terminal of said first source, the cathode of said first tube to the anode of said second tube, the cathode of said second tube to the negative terminal of said second source and the positive terminal of said second source to the negative terminal of said first source and to ground, said load connected between the junction of the anode of said second tube and the cathode of the first tube and ground, the control electrode of each said first and second tube connected through a resistor to a potential negative with respect to the cathode of the respective tube, a voltage gain driver stage comprising a first and a second electron discharge device each having an anode, a cathode and a control electrode; a first and a second anode resistor, a first and a second pair of series connected cathode resistors, a first and a second control electrode resistor, a decoupling resistor, a third direct current source having one terminal grounded, and a feed-back capacitor; a first anode circuit including in series said third source, said decoupling resistor, said first anode resistor, anode to cathode space of said first device, said first pair of cathode resistors and ground; a second anode circuit including in series said third source, said decoupling resistor, said second anode resistor, anode to cathode space of said second device, said second pair of cathode resistors and ground; said first control electrode resistor with connections to the control electrode of said first device and the junction of said first pair of cathode resistors, said second control electrode resistor with connections to the control electrode of said second device and the junction of said second pair of cathode resistors, said feed-back capacitor with connections to the ungrounded terminal of said load and the junction of said decoupling resistor and said first and second anode resistors, a first coupling circuit including a capacitor with connections to said first device anode and the control electrode of said first tube, a second coupling circuit including a capacitor with connections to the second device anode and the control electrode of said second tube, and signal voltage source means to excite the devices with oppositely phased signal voltages connected to the respective control electrodes of said first and second devices.

4. An amplifier including in combination, a first and a second electron discharge device each having at least an anode, a cathode and a control electrode; a source of direct current energy with a positive and a negative terminal and a center tap connected to ground; a ring circuit with series connections from said positive terminal to the anode of said first device, the cathode of said first device to the anode of said second device, the cathode of said second device to said negative terminal; means for biasing the control electrode with respect to the cathode of each of said first and second devices respectively, means for coupling a load between the connection of the cathode of said first device and the anode of said second device and ground, a voltage gain driver stage comprising a third and a fourth electron discharge device each having at least an anode, a cathode and a control electrode, two anode resistors, two cathode resistors, said cathode resistors connected in series and included in a circuit between the cathodes of said third and fourth devices, said anode resistors connected in series between the anodes of said third and fourth devices, the junction of said cathode resistors connected to said ground, means for supplying direct current to the junction of said anode resistors and to the junction of said cathode resistors and coupling said junction of anode resistors to a point having signal output potential, the anodes of said third and fourth devices coupled to the control electrodes of said first and second devices, means for biasing the control electrodes with respect to the cathodes of each of said third and fourth devices respectively, and signal voltage source means for supplying oppositely phased signals to the respective control electrodes of said third and fourth devices.

References Cited in the file of this patent

UNITED STATES PATENTS

| | | |
|---|---|---|
| 1,999,327 | Holden | Apr. 30, 1935 |
| 2,358,428 | White | Sept. 19, 1944 |
| 2,428,295 | Scantlebury | Sept. 30, 1947 |
| 2,431,973 | White | Dec. 2, 1947 |
| 2,488,567 | Stodola | Nov. 22, 1949 |

OTHER REFERENCES

Terman text: "Radio Engineering," 3rd ed., pages 301–303. Published 1947 by McGraw-Hill Book Co., New York, N. Y. (Copy in Division 69.)